United States Patent
Zhang et al.

(10) Patent No.: US 12,491,580 B2
(45) Date of Patent: Dec. 9, 2025

(54) WELDING-PAD REPAIR DEVICE AND PAD REPAIR METHOD

(71) Applicants: BOE MLED TECHNOLOGY CO., LTD., Beijing (CN); BOE Technology Group Co., Ltd., Beijing (CN)

(72) Inventors: Wei Zhang, Beijing (CN); Pengju Hu, Beijing (CN); Yang Yu, Beijing (CN); Junchao Lu, Beijing (CN)

(73) Assignees: BOE MLED TECHNOLOGY CO., LTD., Beijing (CN); Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 18/697,275

(22) PCT Filed: Jul. 24, 2023

(86) PCT No.: PCT/CN2023/108875
§ 371 (c)(1),
(2) Date: Mar. 29, 2024

(87) PCT Pub. No.: WO2024/022287
PCT Pub. Date: Feb. 1, 2024

(65) Prior Publication Data
US 2024/0408701 A1 Dec. 12, 2024

(30) Foreign Application Priority Data
Jul. 26, 2022 (CN) .......................... 202210885460.1

(51) Int. Cl.
*B23K 1/00* (2006.01)
*B23K 1/018* (2006.01)
*B23K 3/08* (2006.01)
*B23K 26/36* (2014.01)
(Continued)

(52) U.S. Cl.
CPC .............. *B23K 26/36* (2013.01); *B23K 1/018* (2013.01); *B23K 3/08* (2013.01); *H05K 3/225* (2013.01);
(Continued)

(58) Field of Classification Search
CPC .......... B23K 26/36; B23K 1/018; B23K 3/08; B23K 2101/42; H05K 3/225;
(Continued)

(56) References Cited

U.S. PATENT DOCUMENTS

| | | | |
|---|---|---|---|
| 7,185,427 B2 * | 3/2007 | Willard | H05K 1/0292 |
| | | | 29/850 |
| 2005/0121429 A1 * | 6/2005 | Liao | B23K 26/351 |
| | | | 219/121.78 |

(Continued)

FOREIGN PATENT DOCUMENTS

| | | | | |
|---|---|---|---|---|
| CA | 3006612 A1 * | 6/2017 | ....... | B32B 17/10963 |
| CN | 104470259 A * | 3/2015 | | |

(Continued)

*Primary Examiner* — Kiley S Stoner
(74) *Attorney, Agent, or Firm* — WHDA, LLP

(57) ABSTRACT

The present disclosure provides a welding-pad repair device and a welding-pad repair method. The device includes: a de-soldering component, an insulating layer removal component and a cleaning component; a welding-pad coating mechanism for forming an initial welding pad, where the welding-pad coating mechanism includes a coating component and a curing component; and a welding-pad encapsulation mechanism for performing an encapsulation operation on a welding pad and a circuit exposed at a periphery of the initial welding pad to form a new welding pad having a predetermined exposure pattern. Embodiments of the present disclosure provide a welding-pad repair device and a welding-pad repair method capable of effectively repairing defective pads before and after dies are bonded, thereby solving problems of low product yield and high cost caused by defective welding pads.

17 Claims, 5 Drawing Sheets

(51) Int. Cl.
  *H05K 3/22* (2006.01)
  *B23K 101/42* (2006.01)
  *B33Y 30/00* (2015.01)
(52) U.S. Cl.
  CPC ........... *B23K 2101/42* (2018.08); *B33Y 30/00* (2014.12); *H05K 2203/107* (2013.01)
(58) Field of Classification Search
  CPC ....... H05K 2203/107; H05K 2203/176; H05K 3/22; H05K 3/34; H05K 2203/173; B33Y 30/00
  USPC ................. 228/119, 191, 264, 179.1–180.22
  See application file for complete search history.

(56) References Cited

U.S. PATENT DOCUMENTS

| | | | |
|---|---|---|---|
| 2007/0216419 A1* | 9/2007 | Anderson | H05K 3/225 324/522 |
| 2012/0228013 A1 | 9/2012 | Matienzo et al. | |
| 2014/0158399 A1* | 6/2014 | Ulmer | H05K 3/225 174/250 |

FOREIGN PATENT DOCUMENTS

| | | | | |
|---|---|---|---|---|
| CN | 106157822 A | | 11/2016 | |
| CN | 107249258 A | | 10/2017 | |
| CN | 107567200 A | * | 1/2018 | ............... H05K 3/22 |
| CN | 108391374 A | | 8/2018 | |
| CN | 111836479 A | | 10/2020 | |
| CN | 114126248 A | * | 3/2022 | |
| CN | 114190005 A | | 3/2022 | |
| CN | 114641147 A | | 6/2022 | |
| CN | 218277338 U | | 1/2023 | |
| CN | 116135424 A | * | 5/2023 | |
| EP | 4008469 A1 | * | 6/2022 | ........... B23K 1/0016 |
| KR | 20150070028 A | * | 6/2015 | |
| KR | 20180087896 A | | 8/2018 | |
| KR | 102084148 B1 | * | 3/2020 | |
| KR | 2021096038 A | * | 8/2021 | ............. B23K 26/34 |
| WO | 2017/142150 A1 | | 8/2017 | |
| WO | WO-2022049883 A1 | * | 3/2022 | |
| WO | WO-2022144608 A1 | * | 7/2022 | ............. H05K 1/167 |
| WO | WO-2024022287 A1 | * | 2/2024 | ............. B23K 1/018 |

\* cited by examiner

WELDING-PAD REPAIR DEVICE AND PAD REPAIR METHOD

CROSS-REFERENCE TO RELATED APPLICATIONS

This application is the U.S. national phase of PCT Application No. PCT/CN2023/108875 filed on Jul. 24, 2023, which claims priority to Chinese Patent Application No. 202210885460.1 filed in China on Jul. 26, 2022, the entire contents of which are hereby incorporated by reference.

TECHNICAL FIELD

The present disclosure relates to the field of display technologies, and more particularly, to a welding-pad repair device and a welding-pad repair method.

BACKGROUND

Surface Mounted Technology (SMT) is a popular technology and process in the electronic assembly industry, and is a method of placing an electronic element with pins on a surface of a base substrate with circuits and welding pads, and performing soldering assembly by means of reflow soldering or dip soldering, etc.

SUMMARY

Embodiments of the present disclosure provide a welding-pad repair device and a welding-pad repair method capable of effectively repairing defective pads before and after dies are bonded, thereby solving problems of low product yield and high cost caused by defective pads.

The technical solutions provided by the embodiments of the present disclosure are as follows.

In a first aspect, embodiments of the present disclosure provide a welding-pad repair device for repairing a to-be-repaired welding pad on a circuit board; the welding-pad repair device includes:
  a welding-pad preprocessing mechanism configured for performing a preprocessing operation on the to-be-repaired welding-pad and an adjacent welding-pad of the to-be-repaired welding-pad, thereby obtaining a to-be-repaired region B;
  a welding-pad coating mechanism configured for forming an initial welding pad; wherein the welding-pad coating mechanism includes a coating component and a curing component, the coating component is configured for coating a conductive material in the to-be-repaired region, and the curing component is configured for curing the coated conductive material to form the initial welding pad; and
  a welding-pad encapsulation mechanism configured for encapsulating at least an area where the initial welding pad is located to form a new welding pad having a predetermined exposure pattern;
  wherein the welding-pad preprocessing mechanism includes:
  a de-soldering component configured for performing de-soldering processing on welding pads at an initial region; wherein the initial region includes the to-be-repaired welding pad and the adjacent welding-pad of the to-be-repaired welding-pad;
  an insulating layer removal component configured for removing a part of an insulating layer at a periphery of the initial region adjacent to traces, thereby exposing a part of the traces to form a to-be-repaired region; and
  a cleaning component configured for cleaning the to-be-repaired region.

Illustratively, the welding-pad repair device further includes:
  a working table for placing the circuit board;
  wherein the working table includes different working positions, and the welding-pad preprocessing mechanism, the welding-pad coating mechanism and the welding-pad encapsulation mechanism are sequentially arranged at the different working positions; or,
  the working table has at least one working position, and the welding-pad preprocessing mechanism, the welding-pad coating mechanism and the welding-pad encapsulation mechanism are respectively movable to the working position to perform a corresponding operation.

Illustratively, the welding-pad coating mechanism further includes a welding-pad trimming component configured for trimming the initial welding pad such that the initial welding pad meets a predetermined standard; and the predetermined standard includes that the initial welding pad has a predetermined thickness, a predetermined shape, and a predetermined flatness.

Illustratively, the welding-pad trimming component includes a laser repair component configured for trimming at least one of thickness, shape and flatness of the initial welding-pad by laser.

Illustratively, the welding-pad encapsulation mechanism includes:
  an encapsulation component configured for coating an encapsulation material on at least an area where the initial welding pad is located, thereby performing encapsulation;
  a trimming component configured for trimming an outer encapsulated layer of the encapsulated welding pad, thereby obtaining a new welding pad with a predetermined exposed shape.

Illustratively, the encapsulation component includes a coating needle configured for coating insulating resin material at a periphery of the initial welding pad, and/or a 3D printer configured for printing the insulating resin material at the periphery of the initial welding pad through 3D printing; and/or,
  the trimming component includes a laser trimmer configured for cutting the encapsulation material by laser.

Illustratively, the de-soldering component includes a fusion welding laser configured for performing welding by emitting laser light and/or an infrared welder configured for performing welding by infrared rays;
  the insulating layer removal component includes an insulating layer removal laser configured for removing the insulating layer by emitting laser light, and/or a scraper configured for removing the insulating layer by mechanical cutting;
  the cleaning component includes a cleaning laser configured for cleaning foreign matters by emitting laser light, and/or a surface cleaning unit configured for cleaning foreign matters by blowing air to the to-be-repaired region;
  wherein the fusion welding laser, the insulating layer removal laser and the cleaning laser emit different wavelengths of laser light, respectively.

Illustratively, the surface cleaning unit includes:
  at least one air blowing pipe at one side of the to-be-repaired region and configured for blowing air to a surface of the to-be-repaired region; and/or,
  at least one air suction pipe at other side of the to-be-repaired region and configured for sucking air from the surface of the to-be-repaired region;
  wherein when the surface cleaning unit includes the at least one air blowing pipe and the at least one air suction pipe, an air blowing port of the at least one air blowing pipes is opposed to an air suction port of the at least one air suction pipe.

Illustratively, the air blowing port has a tapered shape in which an inner diameter is gradually tapered from a side remote from the air blowing port to a side close to the air blowing port; and/or, the air suction port has a flared shape in which an inner diameter is gradually enlarged from a side remote from the air suction port to a side close to the air suction port.

Illustratively, the air blowing pipe is provided with a shielding member for shielding the air blowing port to prevent foreign matters from being splashed.

Illustratively, the shielding member includes a semi-surrounding cover arranged around an outer circumferential surface of the air blowing pipe and arranged above the air blowing port.

Illustratively, there are at least two de-soldering components; and the at least two de-soldering components are respectively located at opposite sides of the to-be-repaired welding pad and the adjacent welding-pad of the to-be-repaired welding-pad when fusion welding is performed, or at least one of the at least two de-soldering components is movable around a periphery of the to-be-repaired welding pad and the adjacent welding-pad of the to-be-repaired welding-pad.

Illustratively, the welding-pad coating mechanism further includes: an electrical test component configured for testing electrical performance of the initial welding pad.

Illustratively, the electrical test component includes electrical test probes for contacting and conducting electricity with the initial welding pad.

Illustratively, the curing component includes a laser curer.

In a second aspect, embodiments of the present disclosure provide welding-pad repair method for repairing a to-be-repaired welding pad on a circuit board by using the above welding-pad repair device, the method includes the following steps performed in sequence:
  preprocessing the to-be-repaired welding-pad and an adjacent welding-pad of the to-be-repaired welding-pad in a manner including: performing de-soldering processing on welding pads in an initial region, wherein the initial region includes the to-be-repaired welding pad and the adjacent welding-pad of the to-be-repaired welding-pad; removing a part of an insulating layer at a periphery of the initial region adjacent to traces to expose a part of the traces, thereby forming a to-be-repaired region; and cleaning the to-be-repaired region;
  forming an initial welding pad in the to-be-repaired region in a manner including: coating a conductive material on the to-be-repaired region; and curing the coated conductive material to form the initial pad welding; and
  encapsulating at least an area where the initial welding pad is located to form a new welding pad having a predetermined exposure pattern.

Illustratively, the performing de-soldering processing on welding pads in an initial region, includes: performing fusion welding by emitting laser light and/or infrared light to the to-be-repaired welding pad and the adjacent welding-pad of the to-be-repaired welding-pad;
  the removing a part of an insulating layer at a periphery of the initial region adjacent to traces to expose a part of the traces, thereby forming a to-be-repaired region, includes: removing the insulating layer by emitting laser light and/or mechanical cutting;
  the cleaning the to-be-repaired region, includes: cleaning foreign matters by emitting laser light and/or blowing air to the to-be-repaired region;
  the forming an initial welding pad in the to-be-repaired region, further includes: after coating a conductive material on the to-be-repaired region and curing the coated conductive material to form the initial pad welding, trimming the initial welding pad with the welding-pad trimming component so that the initial welding pad reaches a predetermined standard; wherein the predetermined standard includes that the initial welding pad has a predetermined thickness, a predetermined shape, and a predetermined flatness;
  the forming an initial welding pad in the to-be-repaired region, further includes: after coating a conductive material on the to-be-repaired region and curing the coated conductive material to form the initial pad welding, testing electrical performance of the initial welding pad, and determining whether the electrical performance of the initial welding pad reach predetermined parameters; and if not, trimming the initial welding pad until the electrical performance of the initial welding pad reach predetermined parameters;
  wherein the trimming the initial welding pad until the electrical performance of the initial welding pad reach predetermined parameters, includes:
  adjusting at least one of size, shape or flatness of the initial welding pad, and testing the electrical performance of the adjusted initial welding pad, and determining whether the electrical performance of the adjusted initial welding pad reach predetermined parameters; and if not, repeating steps of preprocessing the to-be-repaired welding-pad and the adjacent welding-pad of the to-be-repaired welding-pad and forming an initial welding pad in the to-be-repaired region until the electrical performance of the initial welding pad reach predetermined parameters;
  the encapsulating at least an area where the initial welding pad is located to form a new welding pad having a predetermined exposure pattern, includes:
  coating an encapsulation material at an area where the initial welding pad is located to perform encapsulation; and
  trimming a peripheral encapsulation layer of the encapsulated welding pad to obtain the new welding pad having the predetermined exposure pattern.

The embodiments of present disclosure has the following beneficial effects.

In the above solution, the welding-pad repair device mainly includes the welding-pad preprocessing mechanism, the welding-pad coating mechanism, and the welding-pad encapsulation mechanism. When repairing a welding pad, firstly, a welding pad in an initial region can be subjected to a de-soldering treatment via a de-soldering component in the welding-pad preprocessing mechanism, where the initial region includes the to-be-repaired welding pad and an adjacent welding pad thereof; then, a part of the insulating layer at the periphery of the initial region adjacent to traces can be removed via the insulating layer removal component so as to expose a part of the traces, and in this way, an area of the new welding pad formed by subsequent coating is increased, thereby increasing a contact area with the peripheral trace and then avoiding the problem of excessive resistance. A to-be-repaired region is formed after the insulating layer is removed at the initial region. Then, the to-be-repaired region can be cleaned by the cleaning component, so as to clean and level residues, impurities and foreign matters at the to-be-repaired region, and perform preprocessing work for the coating of a new welding pad. Then, a conductive material are re-coated in the to-be-repaired region by the coating component in the welding-pad coating mechanism, and the coated conductive material is cured by the curing component to obtain a conductive initial welding pad. After that, exposed pads and circuits at the periphery of the initial welding pad are encapsulated, thereby obtaining a new welding pad having a predetermined exposure pattern.

Through the above solution, the circuit board with defective welding pads can be effectively repaired, thereby improving circuit board yield and reducing loss caused by product scrapping.

DETAILED DESCRIPTION

Figure 1:
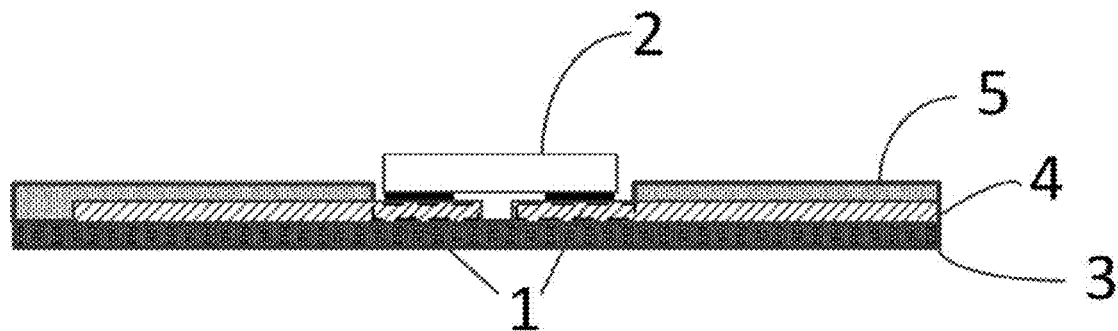
FIG. 1 shows a schematic cross-sectional view of a circuit board with electronic elements and welding pads.

In order to make objects, technical solutions and advantages of embodiments of the present disclosure more apparent, the technical solutions in the embodiments of the present disclosure will be described hereinafter in a clear and complete manner in conjunction with the accompanying drawings of the embodiments of the present disclosure. Obviously, the following embodiments are merely a part of, rather than all of, the embodiments of the present disclosure, and based on these embodiments, a person skilled in the art may obtain the other embodiments, which also fall within the scope of the present disclosure.

Unless otherwise defined, technical terms or scientific terms used in the present disclosure are intended to be understood in the ordinary meaning of the ordinary skill of the art. The words "first", "second" and similar terms used in the application do not denote any order, quantity, or importance, but are used to distinguish different components. Similarly, words such as "a", "an", or "the" do not denote a limitation of quantity, but rather denote the presence of at least one of referenced item. The words such as "including", "includes" mean that, an element or item preceding the word is intended to cover the element, or item, or equivalents thereof, which is listed after the word, instead of excluding other elements or items. The words "connect" or "connected" and the like are not limited to physical or mechanical connections, but may include electrical connections, whether direct or indirect. "Upper", "lower", "left", "right", etc. are only used to indicate the relative positional relationship, and when the absolute position of the described object is changed, the relative positional relationship may also be changed accordingly.

Before describing in details the welding-pad repair device and the welding-pad repair method provided by embodiments of the present disclosure, it is necessary to describe the related art as follows.

In the SMT process, in order to complete fixed connection between an electronic element and a welding pad, it is necessary to provide solder on the welding pad, which is to be electrically connected with the electronic element, on a substrate, or to provide solder on pins of the electronic element, and then to align and contact the electronic element with the welding pad, for example, at a high temperature of 230° C.-260° C., so as to melt the solder and obtain good wetting, and then to rapidly cool down to achieve the fixed connection between the electronic element and the welding pad. The material of the welding pad is usually copper, but copper is more susceptible to oxidation, thus requiring oxidation-resistant treatment of the surface of the welding pad. The surface treatment of the welding pad includes nickel gold plating or the like or silver paste plating. Thus, the electronic element is directly soldered to the welding pad surface subjected to the oxidation prevention treatment by a reflow soldering process using solder, which is a metal including tin.

In the process of reflow soldering, intermetallic compound (IMC) is formed between the solder and the copper alloy layer and the solder pad. The thickness and composition of the intermetallic compound have a function relationship with the time, temperature and application conditions of the soldering process, and will change internal stress of material joints. Generally, as the thickness of the intermetallic compound increases, the internal stress gradually increases, which will cause brittleness or even fracture of the contact part (solder joint) between the electronic element and the solder pad, thus affecting the connection strength and reliability of the two.

If there are damages, foreign matters, etc., on the surface of the welding pad during the manufacturing process, or in the case of virtual soldering or soldering position deviation of the electronic element during the reflow process, it is necessary to remove the electronic element by de-soldering and re-solder the electronic element firmly in the correct position. However, in the process of removing the electronic element, the solder between the electronic element and the welding pad is inevitably removed, and the solder forms an intermetallic compound with the welding pad, which may damage the welding pad, so that the welding pad cannot be reliably connected to the electronic element again, thereby seriously affecting the product yield and causing the product to be scrapped.

In view of the problems in the related art that a welding pad related defect in the manufacturing process of a circuit board causes a product to be scrapped and a large loss in production, a welding pad repair device and a welding pad repair method provided in the embodiments of the present disclosure can repair a to-be-repaired welding pad on a circuit board so as to solve the problems of a low product yield and a high cost caused by a welding pad defect.

As shown in FIG. 3 to FIG. 8, an embodiment of the present disclosure provides a welding pad repair device including: a welding-pad preprocessing mechanism 10, a welding-pad coating mechanism 20, and a welding-pad encapsulation mechanism 30.

The welding-pad preprocessing mechanism 10 is used for performing a preprocessing operation on a to-be-repaired welding-pad 1a and an adjacent welding-pad 1b thereof so as to obtain a to-be-repaired region B.

Figure 4:
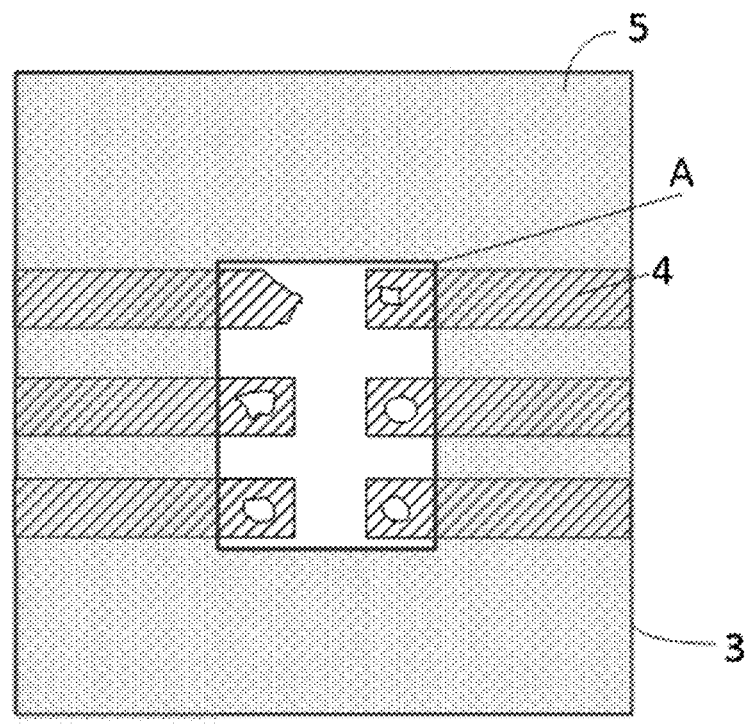
FIG. 4 is a schematic view showing a structure of a to-be-repaired welding pad and a welding pad adjacent thereto after being de-soldered to form an initial region.

Specifically, the welding-pad preprocessing mechanism 10 includes: a de-soldering component 11, an insulating layer removal component 12 and a cleaning component 13. The de-soldering component 11 is used for performing de-soldering processing on welding pads at an initial region A. The initial region A includes a to-be-repaired welding pad 1a and a welding pad 1b adjacent to the to-be-repaired welding pad 1a (as shown in FIG. 4).

In the above solution, the purpose of the de-soldering component 11 is to desolder the initial region A where the to-be-repaired welding pad 1a and the welding pad 1b adjacent thereto are located. For some circuit boards, especially circuit boards with miniature electronic elements, as the resolution of products increases, the precision of welding pads and electrodes of electronic elements becomes higher, the size becomes smaller, and the distance between adjacent electronic elements becomes smaller. The inventors of the present disclosure have found that when a welding pad of an electronic element is problematic, due to the size limitation of the welding pad, if repair is performed only on the welding pad, the coating and trimming of a subsequent new welding pad may be affected, and therefore, the welding pad of an adjacent electronic element may also be repaired so as not to affect the coating and trimming of the subsequent new welding pad.

Figure 2:
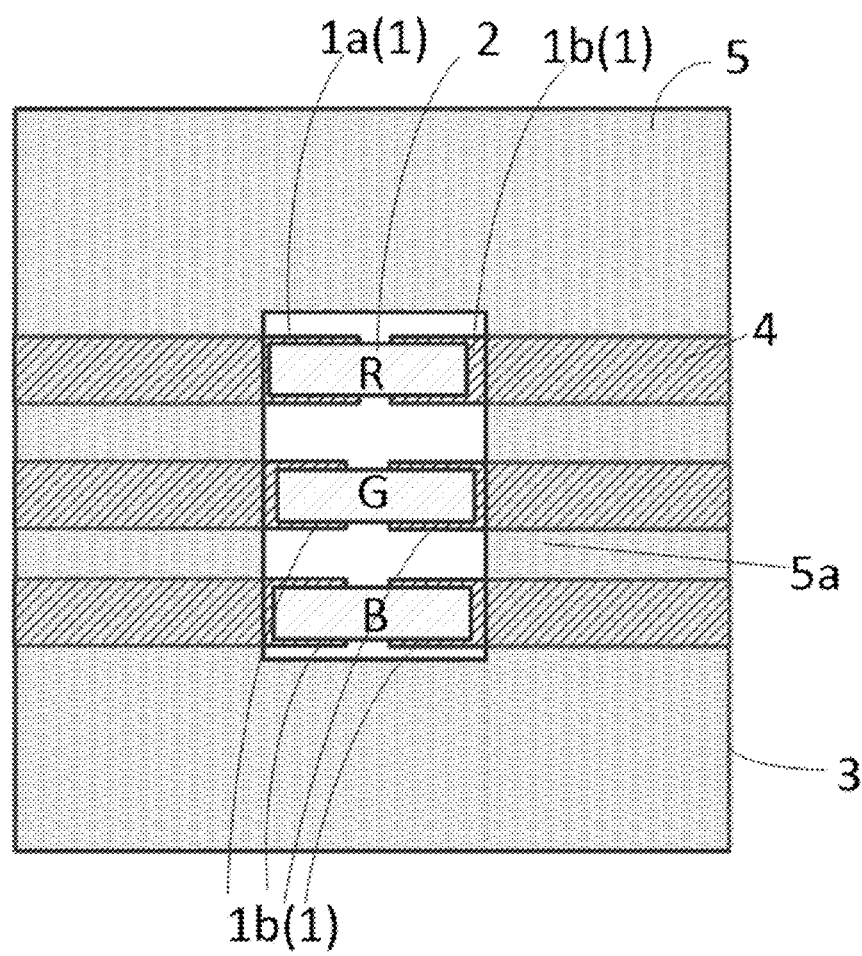
FIG. 2 shows a top view of a circuit board with electronic elements and welding pads.

The electronic element may be a light-emitting diode, and each light-emitting diode having two pins which are corresponding to two welding pads 1 in a one-to-one manner. In some embodiments, light-emitting diodes of different colors may be included, such as red light-emitting diode R, green light-emitting diode G, blue light-emitting diode B. It is to be noted here that the above to-be-repaired welding pad 1a and the welding pad 1b adjacent thereto specifically refer to: as shown in FIG. 1 and FIG. 2, the other welding pad whose distance from the welding pad 1 is less than a certain value range, is a welding pad 1b adjacent to the to-be-repaired welding pad 1a. In practical applications, the value range can be determined according to the precision of devices such as a de-soldering component and a coating component, and the precision of the product of a circuit board itself, etc.

For example, in some embodiments, taking an electronic element being a light-emitting diode as an example, a pixel unit includes a red light-emitting diode R, a green light-emitting diode G and a blue light-emitting diode B, each light-emitting diode can be correspondingly connected to welding pads, all the welding pads in one pixel unit can be considered as a welding-pad group. When any welding pad in the welding-pad group is defective, all the welding pads in the welding-pad group can be subjected to de-soldering repair.

It is understood, of course, that if the distance between the electronic elements on the circuit board is large, and accordingly, the distance between the welding pads corresponding to the electronic elements is large; then, when a certain welding pad is defective, only an adjacent welding pad whose distance from the welding pad is less than a certain value range, may be subjected to the de-soldering repair, while other welding pads adjacent to the welding pad but whose distance is greater than the value range do not need to be de-soldered and repaired.

Figure 5:
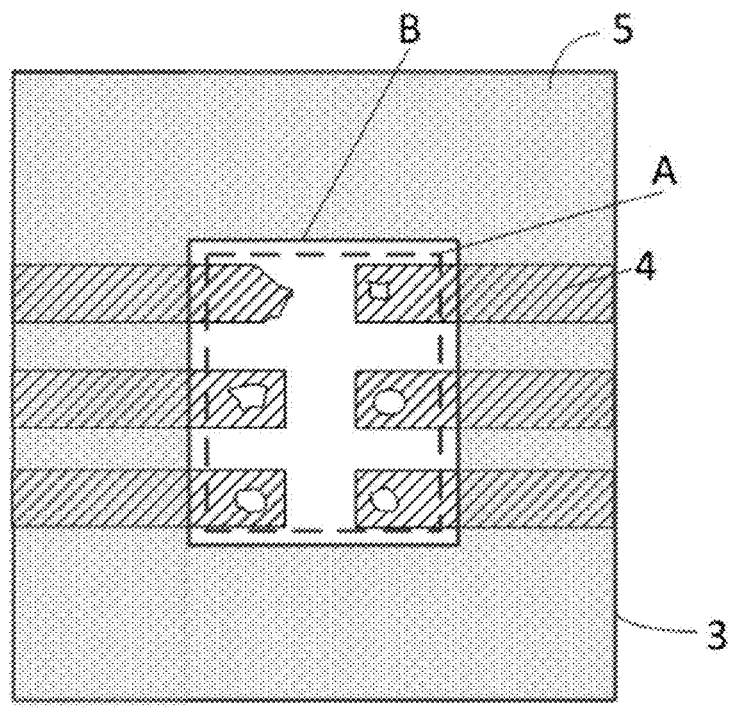
FIG. 5 shows a schematic view of a to-be-repaired region formed after removing part of an insulating layer by an insulating layer removal component in a welding-pad repair device according to an embodiment of the present disclosure.

The insulating layer removal component 12 is used for removing a part of an insulating layer at a periphery of the initial region A adjacent to the traces 4, so as to expose a part of the traces 4 close to the initial region A. After a part of the insulating layer in the initial region A is removed, a to-be-repaired region B is formed (as shown in FIG. 5).

In the above solution, the reason why the insulating layer removal component 12 is provided is:

as shown in FIG. 1 and FIG. 2, the number of welding pads 1 of the electronic element 2 on the circuit board corresponds to the number of pins of the electronic element 2. Taking the electronic element 2 being a light-emitting diode as an example, the light-emitting diode has two pins, the number of corresponding welding pads 1 thereof is two, and one pin is correspondingly connected to one pad 1. A circuit board generally includes a base substrate 3, a trace 4 on the base substrate 3 and an insulating layer 5 located above the trace 4. An opening 5a is defined in the insulating layer 5. One part of each trace 4 exposed by the opening 5a is a welding pad 1. When the to-be-repaired welding pad 1a and the adjacent welding pad 1b thereof are de-soldered, a new welding pad needs to be formed again in the initial region A. In order to further ensure binding reliability of between the new welding pad and the trace used to connect to the original pad while reducing contact resistance between the trace and the new welding pad to ensure the function of the electronic element 2, in the above solution, a part of the insulating layer 5 at the periphery of the initial region A adjacent to the trace 4 is removed by the insulating layer removal component 12, so that an area of the new welding pad formed by subsequent coating is large enough, thereby increasing a contact area with the peripheral trace 4 and then avoiding the problem of excessive resistance. After a part of the insulating layer in the initial region A is removed, a to-be-repaired region B is formed (as shown in FIG. 5).

The cleaning component 13 is used to clean the to-be-repaired region B, and to clean residues, impurities and foreign matter in the to-be-repaired region B, thereby ensuring flatness of the to-be-repaired region B to perform preprocessing work for coating of a new welding pad.

The welding-pad coating mechanism 20 is used to form an initial welding pad C. The welding-pad coating mechanism 20 includes a coating component 21 and a curing component 22. The coating component 21 is used for coating a conductive material in the to-be-repaired region B. The conductive material may include silver paste, copper paste, etc. The curing component 22 is used to cure the coated conductive material to form the initial welding pad C. The curing component 22 may include any suitable device such as a laser curer.

The welding-pad encapsulation mechanism 30 is used to encapsulate at least an area where the initial welding pad C is located to form a new welding pad having a predetermined exposure pattern. In the above solution, the welding-pad encapsulation mechanism 30 is provided so as to prevent oxidation and corrosion by encapsulating the surrounding exposed portions of the initial welding pad C and circuits. It is to be noted that the predetermined exposure pattern refers to a pattern of an area where a new welding pad to be finally formed is exposed outside the insulating layer. The area of the initial welding pad C may be larger than the area of the new welding pad to be finally formed, and the shape thereof is also different from the shape of the new welding pad to be finally formed. That is, the current exposure pattern of the initial welding pad C is different from the predetermined exposure pattern, and therefore, it needs to encapsulate the initial welding pad C so that the final exposure pattern of the initial welding pad C meets the predetermined exposure pattern.

It can be seen therefrom that the welding pad repair device provided by the embodiments of the present disclosure can effectively repair welding pads on a circuit board with poor welding pads, improve the yield of the circuit board and reduce the loss caused by product scrapping.

When the welding-pad repair device is in operation, corresponding operations of the welding-pad preprocessing mechanism 10, the welding-pad coating mechanism 20, and the welding-pad encapsulation mechanism 30 are sequentially performed.

In some embodiments, the welding-pad repair device may include a working table for placing the circuit board. The working table may include different working positions, and the circuit board may be transported to different working positions on the working table. The welding-pad preprocessing mechanism 10, the welding-pad coating mechanism 20, and the welding-pad encapsulation mechanism 30 are sequentially arranged at the different working positions along a transfer path of the working table. In this way, operations of welding-pad preprocessing, welding-pad coating and welding-pad encapsulation are sequentially performed.

In other embodiments, the working table has at least one working position; and the welding-pad preprocessing mechanism 10, the welding-pad coating mechanism 20 and the welding-pad encapsulation mechanism 30 can be moved to the working position, respectively, to perform a corresponding operation.

It is to be understood that the specific locations and the like of the mechanisms of the welding-pad repair device are not limited to the above examples.

Further, as an exemplary embodiment, the de-soldering component 11 may be selected from one or two of a fusion welding laser and an infrared welder. The fusion welding laser performs welding by emitting laser light, and the infrared welder performs welding by infrared rays. The fusion welding laser and the infrared welder can be selected from fusion welding products already available on the market, and the detailed operation principle thereof will not be described in detail herein.

When a fusion welding laser is selected as the de-soldering component 11, wavelength of the emitted laser is controlled to achieve the purpose of de-soldering, with high precision and convenient operation. It is, of course, to be understood that the de-soldering component 11 may also not be limited to the fusion welding laser and the infrared welder.

Further, as an exemplary embodiment, the insulating layer removal component 12 includes one or two of an insulating layer removal laser, or a scraper. The insulating layer removal laser may remove the insulating layer by emitting laser light, and the scraper may remove the insulating layer by mechanical cutting. The insulating layer removal laser and the scraper can be selected from products already available on the market, and the specific working principle thereof will not be described in detail here.

The insulating layer removal laser controls wavelength of emitted laser to remove the insulation layer. By using this laser cutting method to remove the insulating layer, the cutting accuracy is higher and the operation is more convenient compared with other methods to remove the insulating layer. It is, of course, to be appreciated that the insulating layer removal component 12 may also not be limited to a laser or scraper. In practical application, a suitable device can be rationally selected to achieve the purpose of cutting the insulating layer according to practical requirements.

Further, as an exemplary embodiment, the cleaning component 13 includes at least one of a cleaning laser 131 and a surface cleaning unit. The cleaning laser 131 serves to clean foreign matters by emitting laser light. The surface cleaning unit is used to clean foreign matters by blowing air to the to-be-repaired region B. The cleaning laser 131 can clean foreign matters by controlling the wavelength of the emitted laser, with high precision and easy operation.

Figure 3:
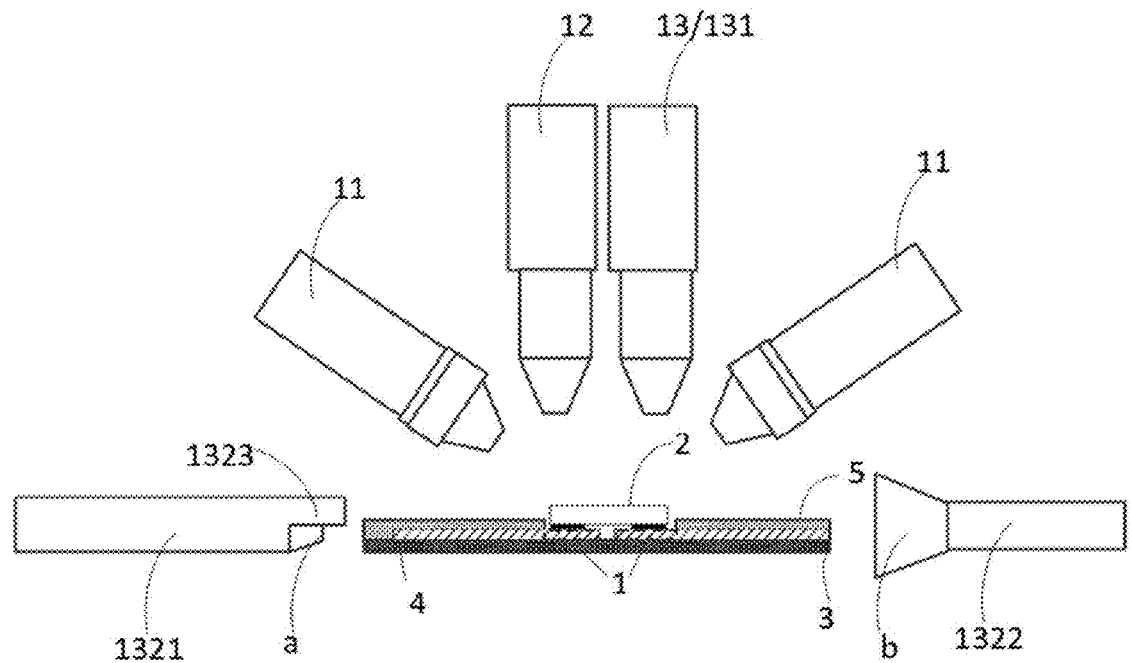
FIG. 3 is a schematic view showing a welding-pad preprocessing mechanism in a welding-pad repair device according to an embodiment of the present disclosure.

As a preferred embodiment, as shown in FIG. 3, the cleaning component 13 may include both a cleaning laser 131 and a surface cleaning unit. In this way, the surface cleaning unit blows away the electronic element 2, molten tin and foreign matters and impurities, to prevent them from affecting the coating process of the welding pads.

It is to be noted that the fusion welding laser, the insulating layer removal laser and the cleaning laser 131 can perform different functions by emitting different wavelengths of laser light, respectively.

As an exemplary embodiment, as shown in FIG. 3, the surface cleaning unit includes: at least one air blowing pipe 1321 located at one side of the to-be-repaired region B and used for blowing air to the surface of the to-be-repaired region B; and at least one air suction pipe 1322 located at the other side of the to-be-repaired region B and used for sucking air from the surface of the to-be-repaired region B. An air blowing port a of at least one air blowing pipes 1321 is opposed to an air suction port b of the at least one air suction pipe 1322.

With the above solution, the surface cleaning unit adopts an air blowing pipe 1321 and an air suction pipe 1322, which are oppositely arranged at two opposite sides of the surface of the to-be-repaired region B; the air blowing pipe 1321 can blow the electronic element 2 and solder to the air suction pipe 1322 after the solder has melted, so as to be sucked away by the air suction pipe 1322. Meanwhile, impurities and foreign matters generated by removing the insulating layer and cleaning the welding pad, can also be blown away to prevent them from affecting the coating process of the welding pads It is to be noted that, in some embodiments, only the air blowing pipe 1321 or only the air suction pipe 1322 may be provided.

Further, as some exemplary embodiments, as shown in FIG. 3, the air blowing port a may be designed to have a tapered shape in which an inner diameter is gradually tapered from a side remote from the air blowing port to a side close to the air blowing port. With such arrangement, the air blowing pipe 1321 has a tapered shape to ensure sufficient blowing force.

As some exemplary embodiments, as shown in FIG. 3, the air suction port b may be designed to have a flared shape in which an inner diameter is gradually enlarged from a side remote from the air suction port to a side close to the air suction port. With such an arrangement, the air suction port b is flared, and it is more convenient to suck foreign matter, impurities, etc.

Further, as shown in FIG. 3, as some exemplary embodiments, the air blowing pipe 1321 is provided with a shielding member 1323 for shielding the air blowing port a to prevent foreign matters from being splashed. By providing the shielding member 1323, the foreign matters in the to-be-repaired region B are prevented from splashing.

For example, the shielding member includes a semi-surrounding cover arranged around an outer circumferential surface of the air blowing pipe 1321 and arranged above the air blowing port a. With such arrangement, the air blowing pipe 1321 may have a hat brim shape at the air blowing port a thereof, so as to effectively shield foreign matters. It is to be understood that, in practical applications, the specific structure of the air blowing pipe 1321 is not limited thereto.

Further, in some exemplary embodiments, as shown in FIG. 3, the number of the de-soldering components 11 is at least two; and at least two de-soldering components 11 are respectively located at opposite sides of the to-be-repaired welding pad 1a and its adjacent welding pad 1b when fusion welding is performed, or at least one de-soldering component 11 is movable around the periphery of the to-be-repaired welding pad 1a and its adjacent welding pad 1b. Such an arrangement facilitates emitting laser or infrared rays from the opposite sides or periphery of the to-be-repaired welding pad 1a and its adjacent welding pad 1b for welding, thereby achieving a better de-soldering effect.

It is, of course, to be understood that the specific number of the de-soldering components 11 is not limited and that only one may be provided and may not be moved.

Figure 6:
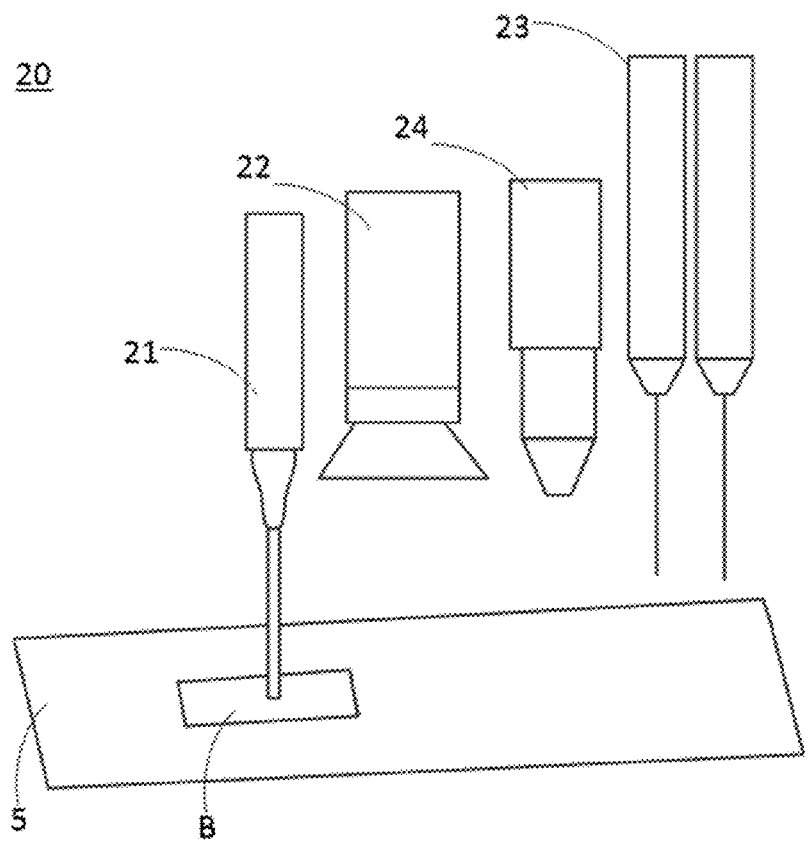
FIG. 6 shows a schematic view of a welding-pad coating mechanism in a welding-pad repair device according to an embodiment of the present disclosure.
Figure 7:
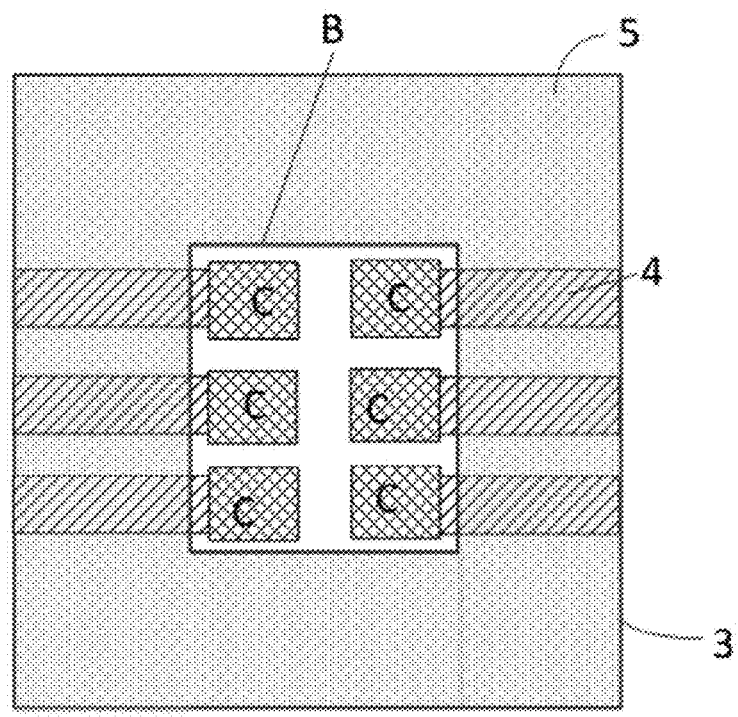
FIG. 7 shows a schematic view of an initial welding pad formed by using a welding-pad repair device to re-coat a conductive material on a circuit board according to an embodiment of the present disclosure.

Further, in some exemplary embodiments, as shown in FIG. 6, the welding-pad coating mechanism 20 further includes a welding-pad trimming component 24 for trimming the initial welding pad C such that the initial welding pad C (as shown in FIG. 7) meets a predetermined standard. The predetermined standard includes that the initial welding pad C has a predetermined thickness, a predetermined shape, and a predetermined flatness.

With the above solution, after the initial welding pad C is obtained by re-coating the conductive material in the to-be-repaired region B, the shape of the initial welding pad C may not meet requirements of accuracy and subsequent alignment. Therefore, in the present embodiment, the welding-pad repair device may further include the welding-pad trimming component 24 for trimming the thickness, shape, flatness, etc. of the initial welding pad C to reach a predetermined standard.

The welding-pad trimming component 24 may optionally adopt a welding-pad trimming laser for trimming at least one of the thickness, shape, and flatness of the initial welding-pad C by the laser.

It is, of course, to be appreciated that the welding-pad trimming component 24 may also be implemented in other ways. Further, as some exemplary embodiments, as shown in FIG. 6, the welding-pad coating mechanism 20 may further include: an electrical test component 23 for testing the electrical performance of the initial welding pad C.

With the above solution, by providing the electrical test component 23, electrical performance such as conductivity and resistance of the trimmed initial welding pad C are tested, so that whether the electrical performance of the initial welding pad C is qualified can be tested, to prevent unqualified (NG) products from flowing to the next process. For example, the electrical test component 23 may include electrical test probes for contacting and conducting electricity with the initial welding pad C.

Specifically, when the electrical performance of the initial welding pad C is tested, it can be determined whether the electrical performance of the initial welding pad C reach predetermined parameters. When it is determined that the electrical performance of the initial welding pad C does not reach the predetermined parameters, the initial welding pad C is trimmed until the electrical performance of the initial pad C reaches the predetermined parameters.

As an exemplary embodiment, when it is determined that the electrical performance of the initial welding pad C does not reach the predetermined parameters, trimming the initial welding pad C means: adjusting at least one of the size, shape or flatness of the initial welding pad C, testing the electrical performance of the adjusted initial welding pad C and determining whether the electrical performance of the adjusted initial welding pad C reaches the predetermined parameters; if the predetermined parameters have not yet been reached, re-de-soldering, coating and curing the initial welding pad C, and performing electrical performance testing again until the electrical performance of the initial welding pad C reach the predetermined parameters.

In addition, the welding-pad coating mechanism 20 may further include a surface treatment component for performing anti-oxidation treatment on the surface of the initial welding pad. For example, the surface treatment component may perform nickel-gold or silver coated treatment.

Figure 8:
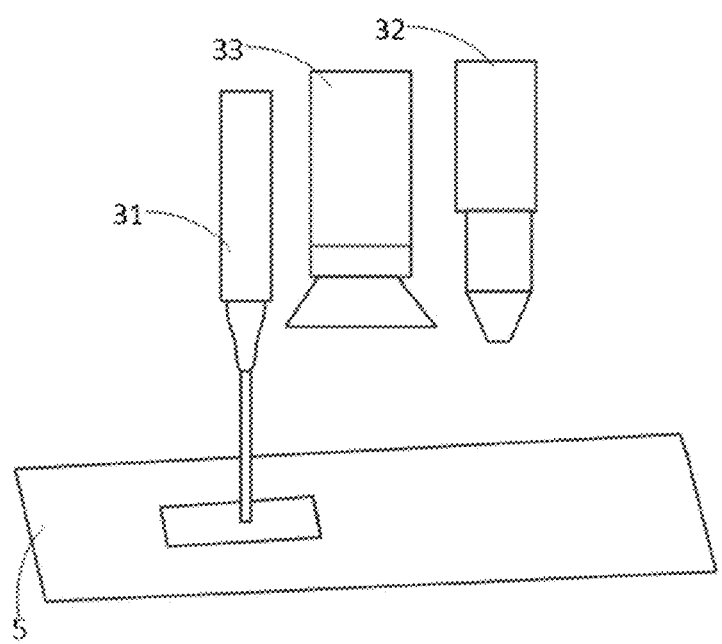
FIG. 8 shows a schematic view of using a welding-pad encapsulation mechanism of a welding-pad repair device to encapsulate an exposed welding pad and a circuit around an initial welding pad according to an embodiment of the present disclosure.

As shown in FIG. 8, in some exemplary embodiments, the welding-pad encapsulation mechanism 30 may further include: an encapsulation component 31 and a trimming component 32. The encapsulation component 31 is used for coating an encapsulation material on exposed pads and circuits at the periphery of the initial welding pad C, so as to perform encapsulation. The trimming component 32 is used to trim an outer encapsulated layer of the encapsulated welding pad to obtain a new welding pad with a predetermined exposed shape (as shown in FIG. 2).

With the above solution, after encapsulating the initial welding pad C, if the coating range of the encapsulation material exceeds the precision specification, the part of the encapsulation material which exceeds the specification can also be trimmed, such as by cutting through the provided trimming component 32, to prevent them from affecting subsequent processes.

The encapsulation component 31 can select at least one of a coating needle that can coat insulating resin material at the periphery of the initial welding pad C, or a 3D printer that can print the insulating resin material at the periphery of the initial welding pad C through 3D printing. It has high packaging precision and is easy to operate. The trimming component 32 can use a laser trimmer that can cut the encapsulation material with a laser, which has high cutting accuracy and is easy to operate. At this point, the encapsulation component 31 can further include an insulating resin curing component 33. The insulating resin curing component 33 may use a curing laser. Of course, it is to be understood that the specific implementation manners of the packaging component 31 and the trimming component 32 are not limited thereto.

Figure 9:
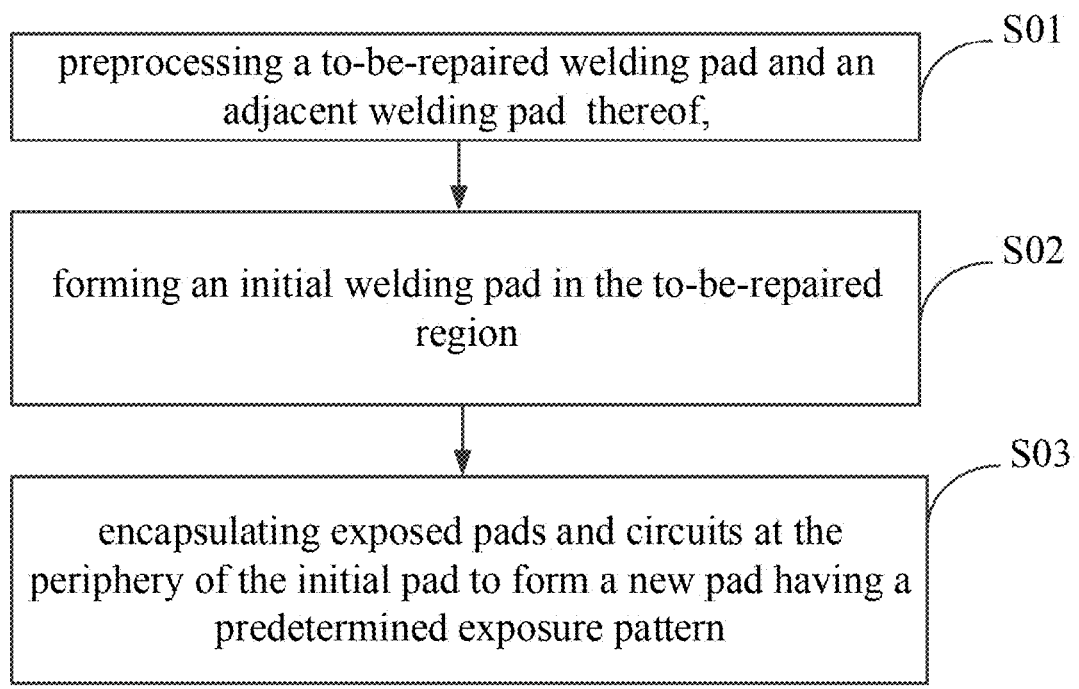
FIG. 9 shows a flowchart of a welding-pad repair method according to an embodiment of the present disclosure.

In addition, one embodiment of the present disclosure further provides a welding-pad repair method for using the welding-pad repair device in the embodiment of the present disclosure to repair the to-be-repaired welding pad 1a on a circuit board. As shown in FIG. 9, the method includes the following steps performed in sequence.

Step S01: preprocessing a to-be-repaired welding pad 1a and an adjacent welding pad 1b thereof, which specifically includes:

Step S011: performing de-soldering processing on welding pads in an initial region A, where the initial region includes a to-be-repaired welding pad 1a and an adjacent welding pad 1b thereof (as shown in FIG. 4);

Step S012: removing a part of an insulating layer at a periphery of the initial region A adjacent to a circuit to expose a part of the circuit, thereby forming a to-be-repaired region B (as shown in FIG. 5);

Step S013: cleaning the to-be-repaired region B;

Step S02: forming an initial welding pad C in the to-be-repaired region B, which specifically includes:

Step S021: coating a conductive material on the to-be-repaired region B;

Step S022: curing the coated conductive material to form the initial pad welding C (as shown in FIG. 7); and Step S03: encapsulating at least an area where the initial welding pad C is located to form a new welding pad having a predetermined exposure pattern.

As an exemplary embodiment, in each of the above steps, the circuit board is sequentially transported to different working positions of the working table according to the above step sequence; alternatively, the circuit board is placed at a working position, and the welding-pad preprocessing mechanism 10, the welding-pad coating mechanism 20 and the welding-pad encapsulation mechanism 30 are respectively moved to the working position according to the above step sequence to perform corresponding operations.

As an exemplary embodiment, the above step S011 specifically includes: performing fusion welding by emitting laser light and/or infrared light to the to-be-repaired welding pad 1a and an adjacent welding pad 1b thereof.

The above step S012 specifically includes: removing the insulating layer by emitting laser light and/or mechanical cutting.

The above step S013 specifically includes: cleaning foreign matters by emitting laser light and/or blowing air to the to-be-repaired region B.

As an exemplary embodiment, the above step S02, after the step S022, further includes:

Step S023: trimming the initial welding pad C with a welding-pad trimming component 3222 so that the initial welding pad C reaches a predetermined standard; where the predetermined standard includes that the initial welding pad C has a predetermined thickness, a predetermined shape, and a predetermined flatness.

As an exemplary embodiment, the step S02, after the step S022, further includes:

Step S023: testing the electrical performance of the initial welding pad C, and determining whether the electrical performance of the initial welding pad C reach predetermined parameters; and Step S024: if not, trimming the initial welding pad C until the electrical performance of the initial welding pad C reach predetermined parameters.

As an exemplary embodiment, the above step S024 specifically includes:

Step S0241: adjusting at least one of size, shape or flatness of the initial welding pad C, and testing the electrical performance of the adjusted initial welding pad C, and determining whether the electrical performance of the initial welding pad C reach predetermined parameters; and Step S0242: if not, repeating steps S01 and S02 until the electrical performance of the initial welding pad C reach predetermined parameters.

As an exemplary embodiment, the above step S03 specifically includes:

trimming at least one of the thickness, shape, and flatness of the initial welding pad C by laser.

As an exemplary embodiment, the above step S03 specifically includes:

Step S031: coating an encapsulation material at exposed pads and circuits at a periphery of the initial welding pad C to perform encapsulation; and Step S032: trimming a peripheral encapsulation layer of the encapsulated welding pad to obtain a new welding pad having a predetermined exposure pattern.

The following points need to be explained:

(1) The drawings relate only to the structures to which the embodiments of the present disclosure relate, and other structures may refer to general designs.

(2) In the drawings used to describe embodiments of the present disclosure, the thickness of layers or regions is enlarged or reduced for clarity, i.e., the drawings are not drawn to actual scale. It is to be understood that when an element such as a layer, film, region or substrate is referred to as being "on" or "under" another element, it can be "directly on" or "directly under" the other element or intervening elements may be present.

(3) Without conflict, embodiments of the present disclosure and features of the embodiments may be combined with each other to provide new embodiments.

The above are only specific embodiments of the present disclosure, but the protection scope of the present disclosure is not limited thereto. The protection scope of the present disclosure should be subject to the protection scope of the claims.

What is claimed is:

1. A welding-pad repair device for repairing a to-be-repaired welding pad on a circuit board; the welding-pad repair device comprising:

a welding-pad preprocessing mechanism configured for performing a preprocessing operation on the to-be-repaired welding-pad and an adjacent welding-pad of the to-be-repaired welding-pad, thereby obtaining a to-be-repaired region B;

a welding-pad coating mechanism configured for forming an initial welding pad; wherein the welding-pad coating mechanism includes a coating component and a curing component, the coating component is configured for coating a conductive material in the to-be-repaired region, and the curing component is configured for curing the coated conductive material to form the initial welding pad; and a welding-pad encapsulation mechanism configured for encapsulating at least an area where the initial welding pad is located to form a new welding pad having a predetermined exposure pattern;

wherein the welding-pad preprocessing mechanism includes:

a de-soldering component configured for performing de-soldering processing on welding pads at an initial region; wherein the initial region includes the to-be-repaired welding pad and the adjacent welding-pad of the to-be-repaired welding-pad;

an insulating layer removal component configured for removing a part of an insulating layer at a periphery of the initial region adjacent to traces, thereby exposing a part of the traces to form a to-be-repaired region; and a cleaning component configured for cleaning the to-be-repaired region.

2. The welding-pad repair device according to claim 1, further comprising:

a working table for placing the circuit board;

wherein the working table includes different working positions, and the welding-pad preprocessing mechanism, the welding-pad coating mechanism and the welding-pad encapsulation mechanism are sequentially arranged at the different working positions; or, the working table has at least one working position, and the welding-pad preprocessing mechanism, the welding-pad coating mechanism and the welding-pad encapsulation mechanism are respectively movable to the working position to perform a corresponding operation.

3. The welding-pad repair device according to claim 1, wherein the welding-pad coating mechanism further includes a welding-pad trimming component configured for trimming the initial welding pad such that the initial welding pad meets a predetermined standard; and the predetermined standard includes that the initial welding pad has a predetermined thickness, a predetermined shape, and a predetermined flatness.

4. The welding-pad repair device according to claim 3, wherein the welding-pad trimming component includes a laser repair component configured for trimming at least one of thickness, shape and flatness of the initial welding-pad by laser.

5. The welding-pad repair device according to claim 1, wherein the welding-pad encapsulation mechanism includes:

an encapsulation component configured for coating an encapsulation material on at least an area where the initial welding pad is located, thereby performing encapsulation;

a trimming component configured for trimming an outer encapsulated layer of the encapsulated welding pad, thereby obtaining a new welding pad with a predetermined exposed shape.

6. The welding-pad repair device according to claim 5, wherein the encapsulation component includes a coating needle configured for coating insulating resin material at a periphery of the initial welding pad, and/or a 3D printer configured for printing the insulating resin material at the periphery of the initial welding pad through 3D printing; and/or, the trimming component includes a laser trimmer configured for cutting the encapsulation material by laser.

7. The welding-pad repair device according to claim 1, wherein the de-soldering component includes a fusion welding laser configured for performing welding by emitting laser light and/or an infrared welder configured for performing welding by infrared rays;

the insulating layer removal component includes an insulating layer removal laser configured for removing the insulating layer by emitting laser light, and/or a scraper configured for removing the insulating layer by mechanical cutting;

the cleaning component includes a cleaning laser configured for cleaning foreign matters by emitting laser light, and/or a surface cleaning unit configured for cleaning foreign matters by blowing air to the to-be-repaired region;

wherein the fusion welding laser, the insulating layer removal laser and the cleaning laser emit different wavelengths of laser light, respectively.

8. The welding-pad repair device according to claim 7, wherein the surface cleaning unit includes:

at least one air blowing pipe at one side of the to-be-repaired region and configured for blowing air to a surface of the to-be-repaired region; and/or, at least one air suction pipe at other side of the to-be-repaired region and configured for sucking air from the surface of the to-be-repaired region;

wherein when the surface cleaning unit includes the at least one air blowing pipe and the at least one air suction pipe, an air blowing port of the at least one air blowing pipes is opposed to an air suction port of the at least one air suction pipe.

9. The welding-pad repair device according to claim 8, wherein the air blowing port has a tapered shape in which an inner diameter is gradually tapered from a side remote from the air blowing port to a side close to the air blowing port; and/or, the air suction port has a flared shape in which an inner diameter is gradually enlarged from a side remote from the air suction port to a side close to the air suction port.

10. The welding-pad repair device according to claim 8, wherein the air blowing pipe is provided with a shielding member for shielding the air blowing port to prevent foreign matters from being splashed.

11. The welding-pad repair device according to claim 10, wherein the shielding member includes a semi-surrounding cover arranged around an outer circumferential surface of the air blowing pipe and arranged above the air blowing port.

12. The welding-pad repair device according to claim 7, wherein there are at least two de-soldering components; and the at least two de-soldering components are respectively located at opposite sides of the to-be-repaired welding pad and the adjacent welding-pad of the to-be-repaired welding-pad when fusion welding is performed, or at least one of the at least two de-soldering components is movable around a periphery of the to-be-repaired welding pad and the adjacent welding-pad of the to-be-repaired welding-pad.

13. The welding-pad repair device according to claim 1, wherein the welding-pad coating mechanism further includes: an electrical test component configured for testing electrical performance of the initial welding pad.

14. The welding-pad repair device according to claim 13, wherein the electrical test component includes electrical test probes for contacting and conducting electricity with the initial welding pad.

15. The welding-pad repair device according to claim 1, wherein the curing component includes a laser curer.

16. A welding-pad repair method for repairing a to-be-repaired welding pad on a circuit board by using the welding-pad repair device according to claim 1, the method comprising the following steps performed in sequence:

preprocessing the to-be-repaired welding-pad and an adjacent welding-pad of the to-be-repaired welding-pad in a manner including: performing de-soldering processing on welding pads in an initial region, wherein the initial region includes the to-be-repaired welding pad and the adjacent welding-pad of the to-be-repaired welding-pad; removing a part of an insulating layer at a periphery of the initial region adjacent to traces to expose a part of the traces, thereby forming a to-be-repaired region; and cleaning the to-be-repaired region;

forming an initial welding pad in the to-be-repaired region in a manner including: coating a conductive material on the to-be-repaired region; and curing the coated conductive material to form the initial pad welding; and encapsulating at least an area where the initial welding pad is located to form a new welding pad having a predetermined exposure pattern.

17. The method according to claim 16, wherein the performing de-soldering processing on welding pads in an initial region, includes: performing fusion welding by emitting laser light and/or infrared light to the to-be-repaired welding pad and the adjacent welding-pad of the to-be-repaired welding-pad;

the removing a part of an insulating layer at a periphery of the initial region adjacent to traces to expose a part of the traces, thereby forming a to-be-repaired region, includes: removing the insulating layer by emitting laser light and/or mechanical cutting;

the cleaning the to-be-repaired region, includes: cleaning foreign matters by emitting laser light and/or blowing air to the to-be-repaired region;

the forming an initial welding pad in the to-be-repaired region, further includes: after coating a conductive material on the to-be-repaired region and curing the coated conductive material to form the initial pad welding, trimming the initial welding pad with the welding-pad trimming component so that the initial welding pad reaches a predetermined standard; wherein the predetermined standard includes that the initial welding pad has a predetermined thickness, a predetermined shape, and a predetermined flatness;

the forming an initial welding pad in the to-be-repaired region, further includes: after coating a conductive material on the to-be-repaired region and curing the coated conductive material to form the initial pad welding, testing electrical performance of the initial welding pad, and determining whether the electrical performance of the initial welding pad reach predetermined parameters; and if not, trimming the initial welding pad until the electrical performance of the initial welding pad reach predetermined parameters;

wherein the trimming the initial welding pad until the electrical performance of the initial welding pad reach predetermined parameters, includes:

adjusting at least one of size, shape or flatness of the initial welding pad, and testing the electrical performance of the adjusted initial welding pad, and determining whether the electrical performance of the adjusted initial welding pad reach predetermined parameters; and if not, repeating steps of preprocessing the to-be-repaired welding-pad and the adjacent welding-pad of the to-be-repaired welding-pad and forming an initial welding pad in the to-be-repaired region until the electrical performance of the initial welding pad reach predetermined parameters;

the encapsulating at least an area where the initial welding pad is located to form a new welding pad having a predetermined exposure pattern, includes:

coating an encapsulation material at an area where the initial welding pad is located to perform encapsulation; and trimming a peripheral encapsulation layer of the encapsulated welding pad to obtain the new welding pad having the predetermined exposure pattern.

* * * * *